(12) United States Patent
Shoji et al.

(10) Patent No.: US 6,496,076 B1
(45) Date of Patent: Dec. 17, 2002

(54) PLL CIRCUIT AND RECORDED DATA REPRODUCTION APPARATUS

(75) Inventors: Norio Shoji, Kanagawa (JP); Kimimasa Senba, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/717,102

(22) Filed: Nov. 22, 2000

(30) Foreign Application Priority Data

Nov. 30, 1999 (JP) .......................................... 11-339280

(51) Int. Cl.[7] .............................. G11B 5/09; G11B 5/035
(52) U.S. Cl. ........................... 331/25; 331/1 A; 360/51; 369/124.15; 369/59.22; 369/47.35
(58) Field of Search .................... 331/1 A, 25; 375/376; 360/51, 65; 369/124.15, 59.17, 47.35, 59.22; 386/85

(56) References Cited

U.S. PATENT DOCUMENTS 6,118,606 A  *  9/2000 Sasaki et al. ................. 360/51

* cited by examiner

*Primary Examiner*—Arnold Kinkead
(74) *Attorney, Agent, or Firm*—Rader, Fishman & Grauer PLLC; Ronald P. Kananen

(57) ABSTRACT

A PLL (phase-locked loop) circuit is configured with a phase-error detection circuit comprises the following: a provisional judge circuit for provisionally judging a data signal being input to an A/D converter into three levels of 1, 0, and −1; a pattern detector which, among data signals being input in accordance with a result of the provisional judgment, checks a transition pattern ranging from a data signal that precedes one clock cycle to the actually present data signal, and then, when a specific pattern is detected, instructs a selector to select output data from the A/D converter; and the selector which, in compliance with instruction from the pattern detector, selects phase-error data from data signals output from the A/D converter, and then converts the selected phase-error data into an electric current before externally delivering it as an error-current.

6 Claims, 7 Drawing Sheets

ADC INPUT

ADC CLOCK

ADC OUTPUT

PROVISIONAL JUDGE CIRCUIT OUTPUT

DN

DN-1

INV

SELECTOR OUTPUT

PLL CIRCUIT AND RECORDED DATA REPRODUCTION APPARATUS

BACKGROUND OF THE INVENTION

1. Field of the Invention

The present invention relates to a PLL (Phase Locked Loop) circuit and a recorded data reproduction apparatus which utilizes the PLL circuit.

2. Description of the Related Art

According to a conventional magnetic disk drive apparatus such as HDD, normally, a data signal read out from the disk is initially quantized using an A/D (analog to digital) converter, and then the quantized data signal is subject to the digital signal processing so that a phase error is detected from the digital signal. Then, the detected error is fed back to the AID converter in order to execute phase locking.

FIG. 6 exemplifies a phase-locked loop circuit built in a conventional magnetic disk drive apparatus. According to this phase-locked loop circuit shown in FIG. 6, after being read out from a magnetic disk, an analog data signal is initially equalized by an analog filter (not shown), which is then quantized by an A/D converter 101 and then optimally equalized by an FIR (Finite Impulse Response) filter 102, and finally, a phase error is detected by digital arithmetic operation of a phase-detector 103.

Next, the detected phase-error data signal is converted into an analog data signal using D/A (digital to analog) converter 104, and then, the analog data signal is delivered to a VCO (voltage-controlled oscillator) 106 through a loop filter 105 as voltage for controlling its oscillation. A clock signal oscillated by the VCO 106 is delivered to the A/D converter 101 as its own sampling clock signal.

Nevertheless, when operating the above-cited phase-locked loop circuit, depending on a tap number of the FIR filter 102, delay corresponding to a minimum of three (3) through five (5) clock cycles is generated. Further, in order to execute an arithmetic operation for detecting a phase error, still further duration corresponding to several clock cycles is required. Because of this, loss time in the phase-locked loop expands. Inasmuch as oscillation is apt to be generated when increasing loop-gain, loop-gain can hardly be raised.

As a means for solving the problem, such a method is conceivable, which detects a phase error from an equalized data signal before delivery to the FIR filter 102. However, even in this case, since a data signal output from the A/D converter 101 delays one or more clock cycles against the sampling timing, it results in the generation of loop-delay by one to several clock cycles.

FIG. 7 shows an example of a phase-locked loop circuit built in a tape drive apparatus. In FIG. 7, after being read out from a magnetic tape, an analog signal being equalized by an analog filter (not shown) is then quantized by an A/D converter 201, and then the quantized analog signal is optimally equalized by an FIR (Finite Impulse Response) filter 202. On the other hand, a pulse detector 203 executes comparison between the analog signal to be delivered to the A/D converter 201 and a proper threshold value, and then converts the analog signal into a pulse signal.

Simultaneously, a phase-comparator 204 compares a phase of the pulse signal with a phase of the pulse output from a voltage-controlled oscillator VCO 206, and then delivers the phase-difference data to the VCO 206 through a loop filter 205 as the voltage for controlling its oscillation. A clock signal,oscillated by the VCO 206 is delayed by a clock-delay circuit 207 and then delivered to the A/D converter 201 as its own sampling clock signal.

Concretely, according to the above-referred phase-locked loop circuit shown in FIG. 7, by causing the phase of the pulse output from the VCO 206 to be locked with the phase of the pulse signal output from the pulse detector 203, loss time of the PLL (Phase-Locked Loop) is eliminated. Nevertheless, when operating this conventional phase-locked loop circuit based on a pulse-detection system, in order to optimize sampling timing of the A/D converter 201, it was necessary to properly adjust timing by inserting the clock delay circuit 207.

SUMMARY OF THE INVENTION

The invention has been realized in consideration of the above technical problem to solve. The object of the invention is to provide a novel PLL (Phase-Locked Loop) circuit which is capable of minimizing loss time of the loop and enhancing loop gain without necessarily adjusting timing of sampling clock of an AID converter, while the invention also provides a recorded-data reproduction apparatus utilizing the novel PLL circuit.

According to the present invention, a PLL (Phase-Locked Loop) circuit comprises an A/D converter which quantizes an input signal substantially being equalized into a waveform conforming to a partial-response (PR) system; and a phase-error detection circuit including a pattern detector which detects a pattern of the waveform of the signal being input to the A/D converter, and then, based on a result of the detection by the pattern detector, extracts an phase error from the data output from the A/D converter, in which the PLL circuit executes phase locking by causing a phase-error output from the phase-error detection circuit to be fed back to the A/D converter. The PLL circuit is utilized in a recorded data reproduction apparatus for reproducing a magnetic disk or an optical disk, as a phase-locked loop circuit for executing phase locking so that a phase difference between a sampling clock of the A/D converter for quantizing the input signal substantially equalized into the waveform of the partial response system and the input signal becomes zero (0).

In the PLL circuit and the recorded data reproducing apparatus utilizing the PLL circuit constructed as described above, a waveform pattern of the input signal to the A/D converter is detected by the pattern detector, and a phase error is extracted from the data output from the A/D converter in accordance with the detection result. The extracted phase error data is, for example, integrated by a loop filter, so as to be given to a voltage control oscillator as a control voltage. The oscillation clock of the voltage control oscillator is used as a sampling clock of the AID converter.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Figure 1:
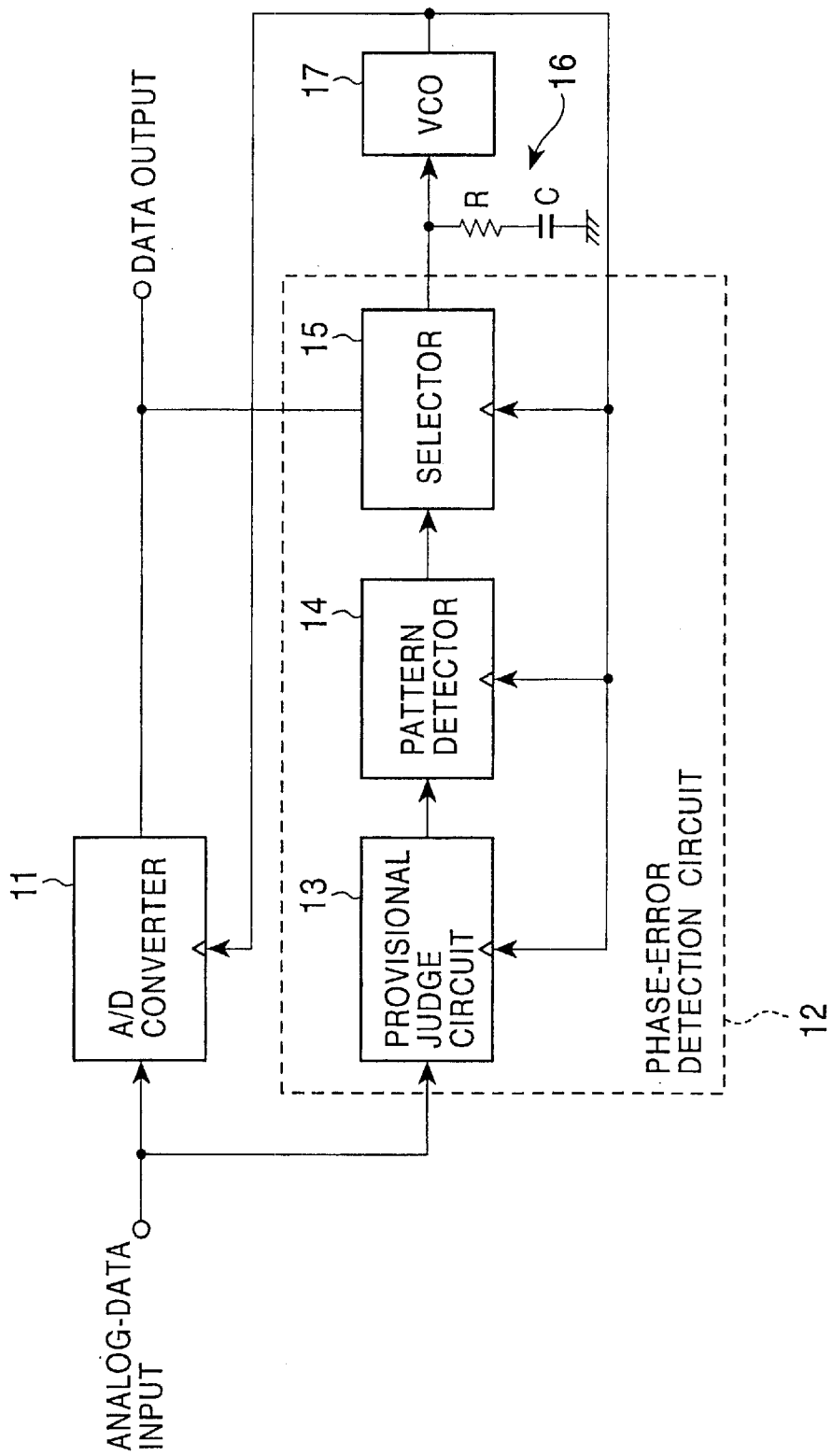
FIG. 1 is a block diagram showing a configuration of a PLL circuit according to an embodiment of the present invention.

Now, a preferred embodiment of the present invention will be described precisely with reference to the attached drawings. FIG. 1 is a block diagram showing a configuration of a PLL circuit according to an embodiment of the present invention.

In FIG. 1, the PLL circuit according to the present invention comprises a phase-error detection circuit 12 which is disposed in parallel with an A/D converter 11 for converting an input analog signal into a digital signal. The phase-error detection circuit 12 comprises the following: a provisional judge circuit 13 for provisionally judging a waveform pattern of the input signal received by the A/D converter 11; a pattern detector 14 for detecting the waveform pattern in accordance with the signal output from the provisional judge circuit 13, and a selector 15 for selecting data signals output from the A/D converter 11 in compliance with instruction from the pattern detector 14.

A comparative signal output from the phase-error detection circuit 12 is initially integrated by a loop filter 16 comprising a resistor R and a capacitor C which are respectively connected in series between an output terminal of the phase-error detection circuit 12 and the ground, and then delivered to a voltage-controlled oscillator (VCO) 17 as the voltage for controlling oscillation. An oscillation clock signal from the voltage-controlled oscillator (vCo) 17 is delivered to the A/D converter 11 as its own sampling clock.

Incidentally, as one of the reproduction signal processing systems to promote density of magnetic disks and optical disks, a PRML (partial response maximum likelihood) system by way of combining partial response (PR) with Viterbi signal value is known. The PR is a system for efficiently executing signal transmission by allowing generation of intersymbol interference in the waveform on a receiver side. Depending on the method of generating intersymbol interference, the PR is classified into plural classes. For example, such a reproduction signal being equalized into response characteristics corresponding to PR1 of the class 1 has ternary data comprising 1, 0, and −1 in the sampling timing. Further, the above-cited reproduction signal also has such a specific feature in which the reproduction signal imperatively passes through value 0 in the course of transition from 1 to −1 and from −1 to 1.

The reproduction signal level being equalized into PR1 comprises the ternary value including 0, 1, and 2. However, a DC component is cut off in an actual reproduction signal system, and thus, for practical convenience, a level of the proper value 1 is defined to be 0. Availing of this, by way of selecting data 0 when reproduction signal transits from 1 or −1 to 0 and from 0 to 1 or −1, the selected data 0 can be used as phase-error data.

Figure 2:
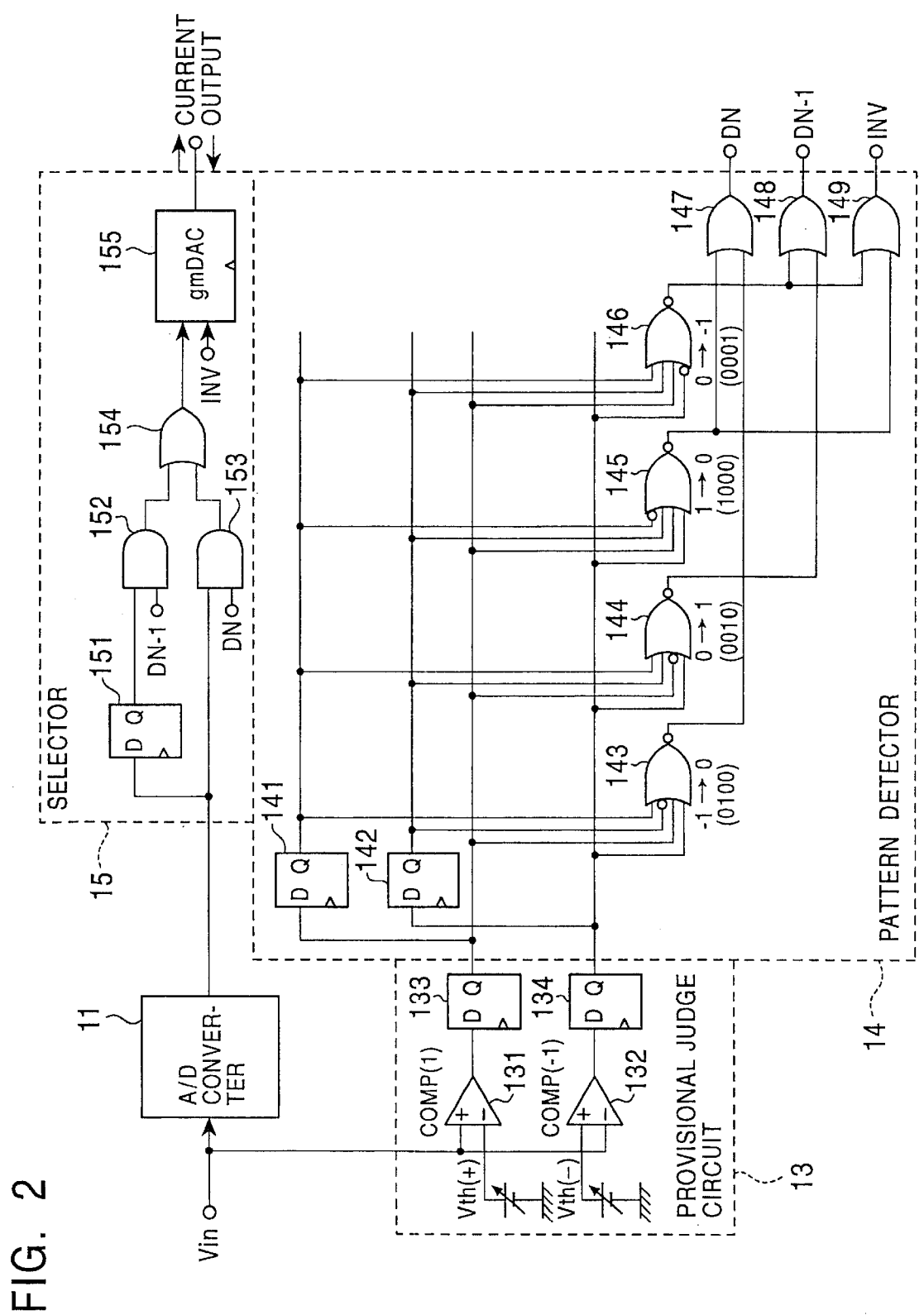
FIG. 2 is a block diagram showing an example of a specific configuration of a phase error detecting circuit.

FIG. 2 shows a concrete configuration of the phase-error detection circuit 12 comprising the provisional judge circuit 13, the pattern detector 14, and the selector 15.

First, a configuration of the provisional judge circuit 13 is described below. The provisional judge circuit 13 comprises the following: a comparator 131 which receives non-inverted (+) input data Vin delivered to the A/D converter 11 and also receives a predetermined threshold voltage Vth (+) as inverted(−) input data; another comparator 132 which receives input data Vin as inverted input data and also receives a predetermined threshold voltage Vth (−) as non-inverted input data ; and a pair of D-FF's (flip-flops) 133 and 134 which individually latch comparative data output from the above comparators 131 and 132, respectively.

Figure 3:
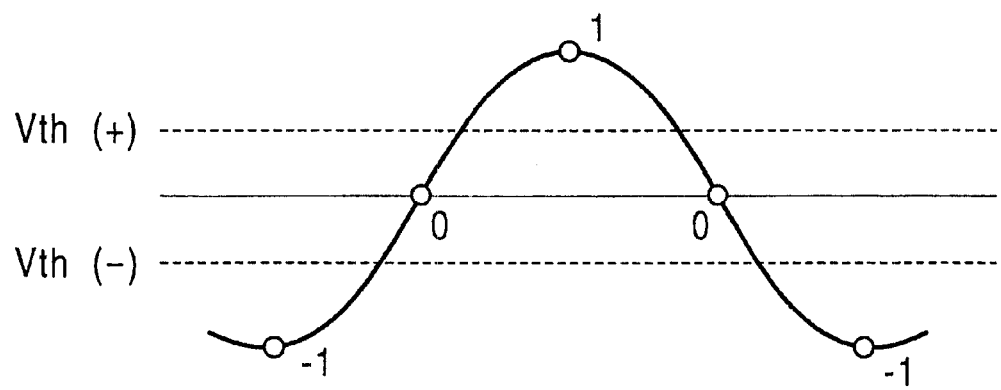
FIG. 3 is a waveform chart showing the relationship between an input waveform and a threshold voltage for ternary judgment.

As shown in FIG. 3, the above-specified threshold voltage Vth (+) and Vth (−) are respectively set to a value between 0 and 1 and between 0 and −1. Based on .this arrangement, the comparators 131 and 132 respectively determine whether the input data Vin corresponds to 1 or not and −1 or not. As a result, based on the threshold voltage Vth (+) and Vth (−), the provisional judge circuit 13 provisionally judges the input data Vin delivered to the A/D converter 11 into three levels of 1, 0 and −1. Assuming that the result of the comparison executed by the comparators 131 and 132 comprises 2-bit data, result of the provisional judgment drawn by the provisional judge circuit 13 is designated as shown in Table 1.

TABLE 1

| Provisionally judged value | COMP (1) | COMP (−1) |
|---|---|---|
| 1 | 1 | 0 |
| 0 | 0 | 0 |
| −1 | 0 | 1 |

It should be noted that, although a pair of omparators 131 and 132 shown in the provisional judge circuit 13 are respectively depicted as if they are configured separately from the A/D converter 11 in FIG. 2, however, in the actual composition, both comparators 131 and 132 may be jointly incorporated in the A/D converter 11. By way of providing the A/D converter 11 with such a circuit formation identical to that of these comparators that compose the A/D converter 11, it advantageously promotes further downsizing of the scale of circuits. Likewise, the D-FF's (flip-flops) 133 and 134 are provided with the circuits identical to the latch circuit of the A/D converter 11. Further, clock wiring of the D-FF's 133 and 134 are connected to the wiring identical to that of the sampling clock of the A/D converter 11.

As a result of the above-referred arrangement, on the part of the provisional judge circuit 13, timing for provisional judgment is arranged to be as close to the sampling timing of the A/D converter 11 as possible. The threshold voltage Vth (+) and Vth (−) required for provisional judgment are respectively provided in the form of analog voltage independent of the quantizing level of the A/D converter 11, and thus, it is possible to set any arbitrary value between 0 and 1 and between 0 and −1.

Next, operation of the pattern detector 14 is described below. Among the input signals, the pattern detector 14 checks any transition pattern from the data preceding one clock cycle to the currently presenting data. When a specific pattern is detected, the pattern detector 14 instructs the rear-stage selector 15 at the next stage to select data output from the A/D converter 11.

The pattern detector 14 shown in FIG. 2 comprises the following: a pair of D-FF's (flip-flops) 141 and 142 which individually latch signals Q output from the other D-FF (flip-flops) 133 and 134 of the provisional judge circuit 13; four NOR gates 143 to 146 at which signals Q output from the D-FF's (flip-flops) 133 and 134 and also from the D-FF's (flip-flops) 141 and 142 are made to be four inputs in accordance with a predetermined combination; and three OR gates 147 to 149 at which signals delivered from the NOR gates 143 to 146 are made to be two inputs in accordance with a predetermined combination.

The NOR gate 143 receives a signal Q output from the D-FF 141, an inverted signal of a signal Q output from the D-FF 142, and signals Q output from the D-FF'S 141 and 142, thus receiving four input signals. The NOR gate 144 receives signals Q output from the D-FF's 141 and 142, an inverted signal of a signal Q output from the D-FF 133 and also receives a signal Q output from the D-FF 134, thus also receiving four input signals. The NOR gate 145 receives an inverted signal of a signal Q output from the D-FF 141 and also receives signals Q output from the D-FF 142, D-FF 133, and the D-FF 134, thus also receiving four input signals. The NOR gate 146 receives signals Q output from the D-FF 141, D-FF 142, and D-FF 133, and also receives an inverted signal of a signal Q output from the D-FF 134.

On the other hand, the OR gate 147 receives two input signals output from the NOR gates 143 and 145. The OR gate 148 receives two input signals output from the NOR gates 144 and 146. The OR gate 149 receives two input signals output from the NOR gates 145 and 146.

The pattern detector 14 configured as described above stores the provisionally judged value determined by the provisional judge circuit 13 of one preceding clock cycle in the D-FF's (flop-flops) 141 and 142, and the provisional judge circuit 13 detects a pattern by four bits while outputting a provisional detection result. The pattern to be detected by the pattern detector 13 is shown in Table 2.

TABLE 2

| Pattern | DN | DN-1 | INV |
|---|---|---|---|
| −1 → 0 | 1 | 0 | 0 |
| 0 → 1 | 0 | 1 | 0 |
| 1 → 0 | 1 | 0 | 1 |
| 0 → −1 | 0 | 1 | 1 |
| Others | 0 | 0 | 0 |

Output data from the pattern detector 14 comprises 3-bit signals including DN, DN-1, and INV. Detect-output signal DN is a signal selecting a current output from the A/D converter 11. Detect-output signal DN-1 is a signal selecting a one-clock-preceding output from the A/D converter 11. Signal INV inverts polarity of data-signal output from the A/D converter 11.

Assuming from the result of provisional judgment by the provisional judge circuit 13 that transition from −1 to 0 and from 0 to 1 is positive, since gradient of transition from 1 to 0 and from 0 to −1 is inverted, it is necessary to invert polarity of data signal 0 and then feed it back. This in turn causes positive polarity of data signal to be inverted into negative polarity. On the other hand, since the direction of current flowing to the loop filter 16 is inverted in the selector 15, execution of arithmetic operation is not required.

Finally, operation of the selector 15 is described below. In response to the instruction from the pattern detector 14, the selector 15 selects phase-error data from the data signal output from the A/D converter 11, and then delivers the selected phase-error data to the loop-filter 16 disposed at the following stage. Simultaneous with the delivery of the phase-error data signal, the selector 15 converts digital data into current and then outputs it as the phase-error current.

Referring to FIG. 2, the selector 15 comprises the following: a D-FF flop-flop 151 which latches an output signal from the A/D converter 11; an AND gate 152 which receives two input signals including an output signal Q output from the D-FF 151 and a detection-result DN-1 output from the pattern detector 14; an AND gate 153 which receives two input signals including an output signal from the A/D converter 11 and a detection-result DN output from the pattern detector 14; an OR gate 154 which receives two input signals comprising output signals from the AND gates 152 and 153; and a gmDAC (D/A converter) 155 which converts output signals from the OR gate 154 into electric current and then outputs the electric current.

The selector 15 configured as described above stores one-clock-preceding data signal output from the A/D converter 11 in the D-FF flip-flop 151, and then, in response to the instruction from the pattern detector 14, in other words, based on the detection-result DN and DN-1 output from the pattern detector 14, the selector 15 selects the present data or the one-clock-preceding data.

In specific terms, when a level of the detect-output signal DN-1 is 1 (High-level), the AND gate 152 turns ON, to enable the selector 15 to select the one-clock-preceding data stored in the D-FF flip-flop 151. On the other hand, when a level of the detection-output signal DN is 1, the AND gate 153 turns ON to enable the selector 15 to select the present data output from the A/D converter 11.

On the other hand, when the level of the detection-output signals DN-1 and DN are 0 (Low-level), both the AND gates 152 and 153 turn OFF, and thus, no data signal is fed back. Data signal selected by the AND gate 152 or 153 passes through the OR gate 154, and then the data signal is converted into an electric current by the gmDAC 155 before being output as an error current. When a level of the detection-output INV from the pattern detector 14 is 1, the gmDAC 155 inverts the flow-direction of the output current from the pattern detector 14.

Figure 4A:
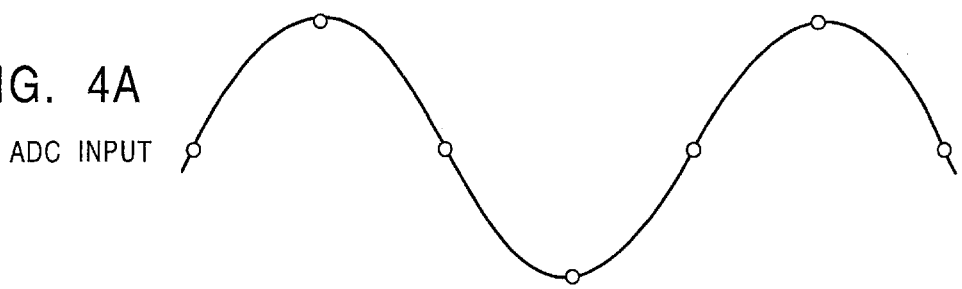
FIGS. 4A–H is a timing chart showing the timing relationship among signals of respective portions of the phase error detecting circuit.
Figure 4B:
Figure 4C:
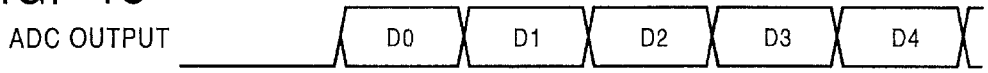
Figure 4D:
Figure 4E:
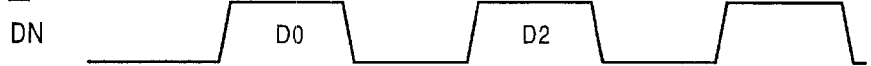
Figure 4F:
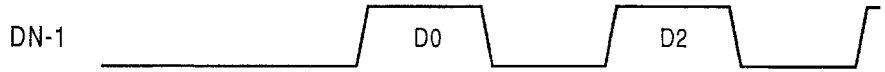
Figure 4G:
Figure 4H:
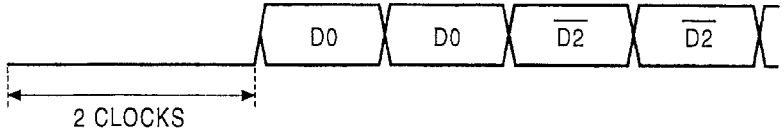

FIGS. 4(A) through (H) are respectively timing charts showing the timing relationship between signals at respective components of the above-referred phase-error detection circuit 12. In these timing charts, FIG. 4(A) shows input data (ADC input) received by the A/D converter 11. FIG. 4(B) shows sampling clock signal .(ADC clock) of the A/D converter 11. FIG. 4(C) shows output data (ADC output) from the A/D converter 11; FIG. 4(D) shows judge signal output from the provisional judge circuit 13. FIGS. 4(E) through 4(G) respectively show detection-result outputs DN, DN-1, and INV from the pattern detector 14. FIG. 4(H) shows output from the selector 15.

As is apparent from the timing charts shown in FIG. 4, delay ranging from the moment at which analog data is sampled by the sampling clock signal in the A/D converter 11 to the moment at which an error current is output from the phase-error detection circuit 12 to the loop filter 16 corresponds to a 2-clock cycle of the sampling clock signal of the A/D converter 11.

Although the above description has solely referred to the embodiment in which the waveform of the data signal being delivered to the A/D converter 11 is based on ternary values, the scope of the practical form of the invention is by no means limited to the above exemplification. For example, when processing data signal based on pentad values, it is also possible to configure the provisional judge circuit 13 with a total of four comparators by way of providing two additional comparators and also providing corresponding circuit configuration for the pattern detector 14.

Figure 5:
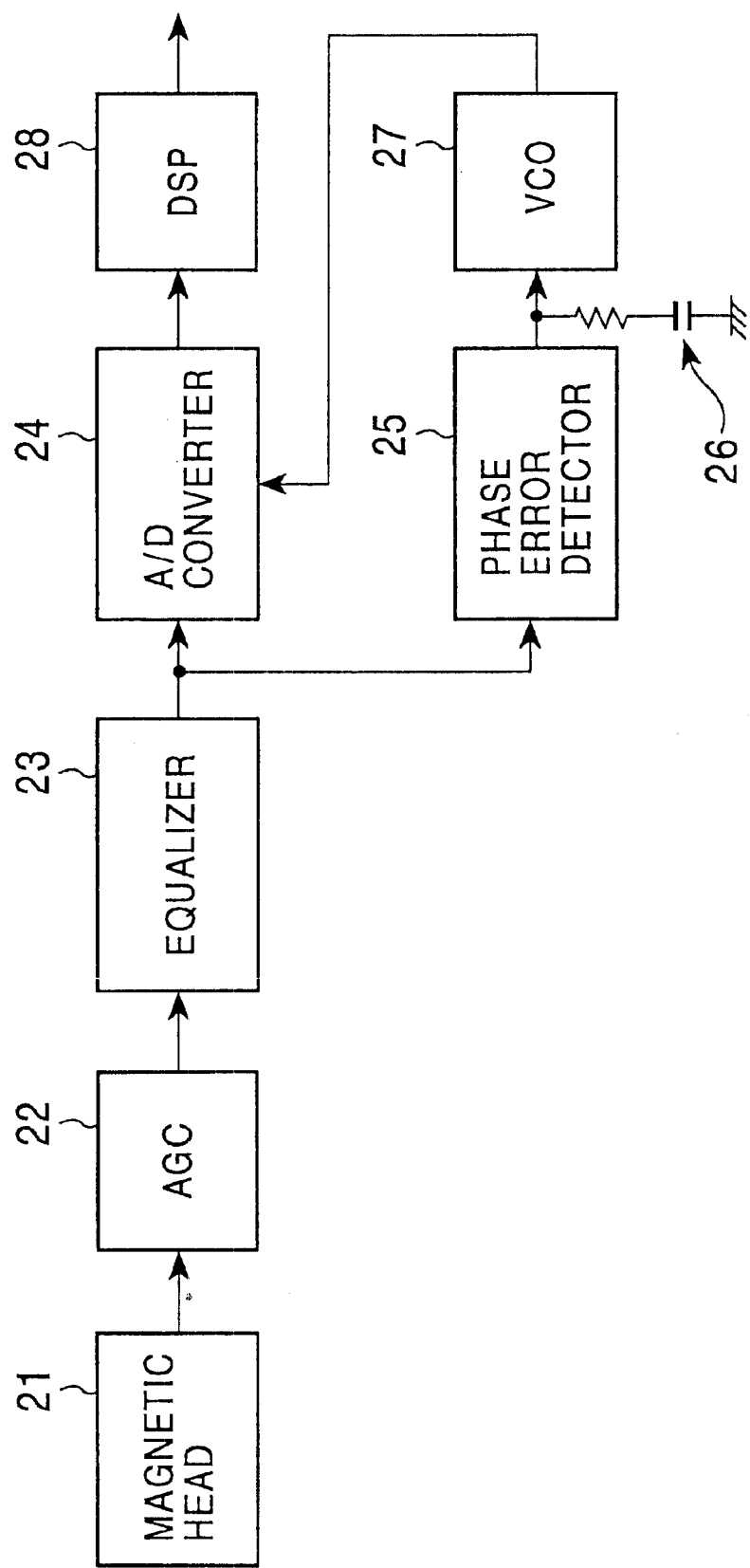
FIG. 5 is a block diagram showing an example of a recorded data reproducing apparatus according to the present invention.
Figure 6:
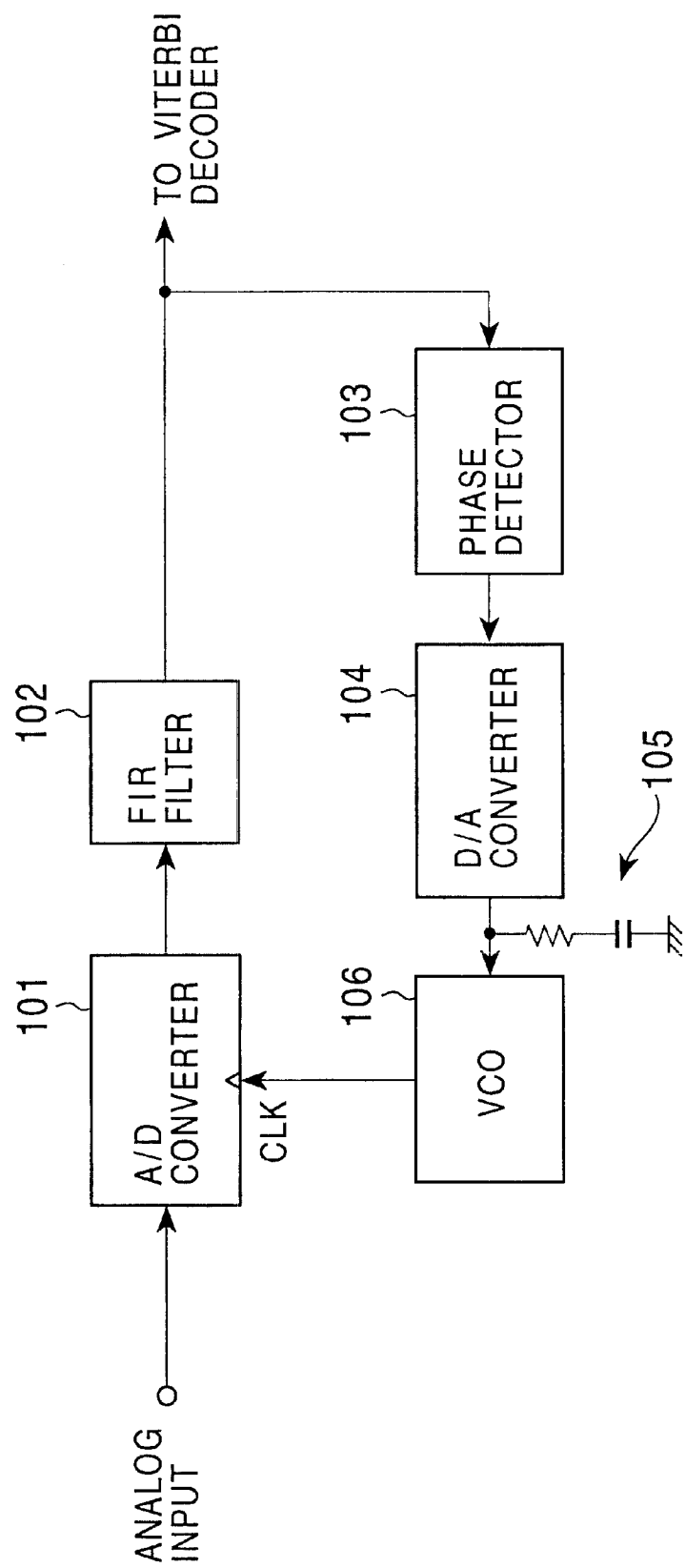
FIG. 6 is a block diagram showing an example of a PLL circuit in a magnetic disk drive apparatus.
Figure 7:
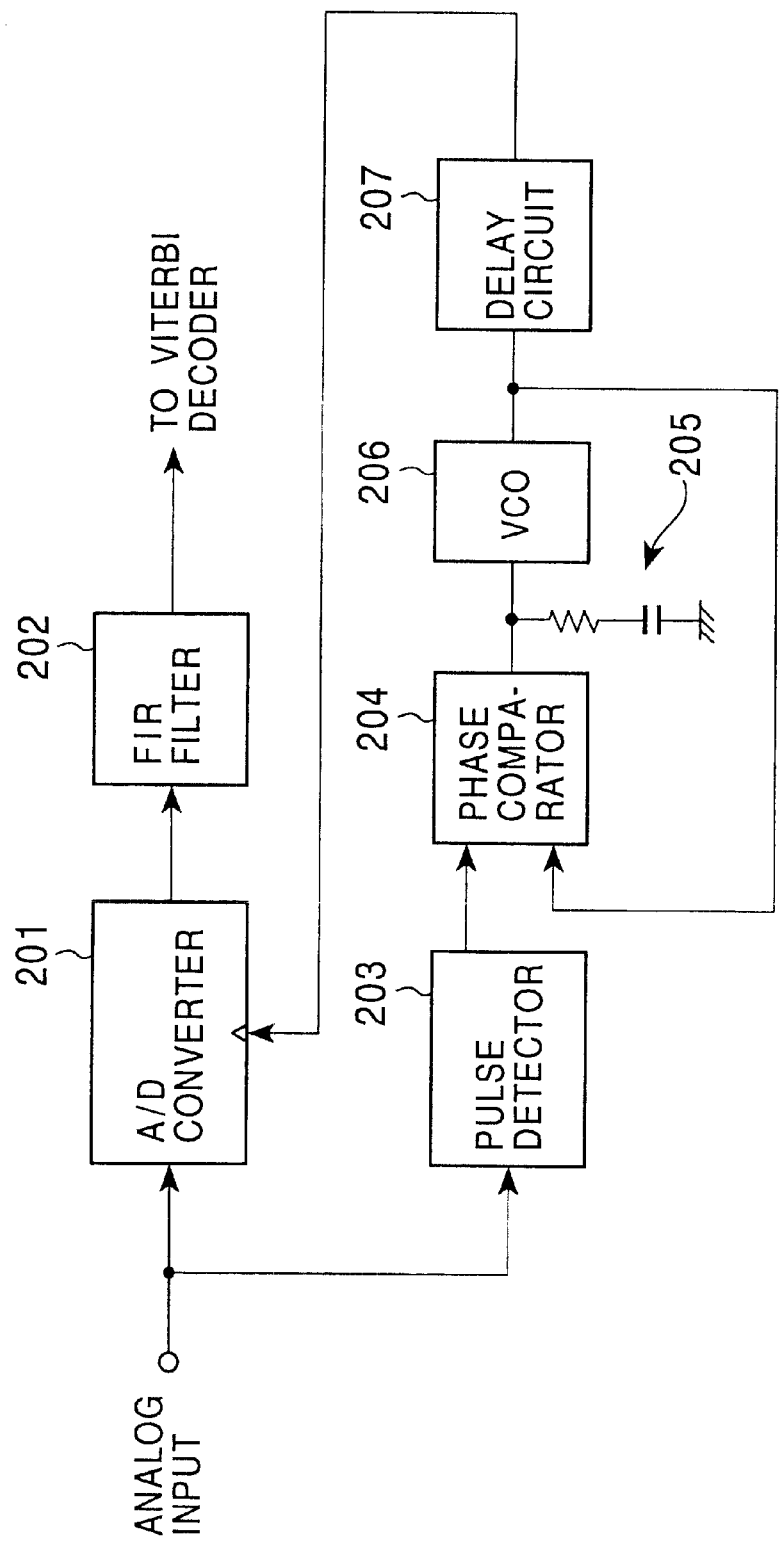
FIG. 7 is a block diagram showing an example of a PLL circuit in a tape drive apparatus.

FIG. 5 is a simplified schematic block diagram of an example of the recorded-data reproduction apparatus according to the present invention. According to this recorded-data reproduction apparatus shown in FIG. 5, data signal recorded on a disk (not shown) is read by a magnetic head 21. The read-out reproduction signal is amplified by AGC (automatic gain control) circuit 22, and then, the amplified signal is substantially equalized into a partial-response waveform by an equalizer 23. Finally, the equalized reproduction data signal is delivered to an A/D converter 24 and a phase-error detection circuit 25. Next, in accordance with on the instruction of the pattern detector 14, the selector 15 selects phase-error data out from data signals output from the A/D converter 24, and then converts the phase-error data into current before externally delivering it. After being integrated by a loop filter 26, the error-detect current is delivered to a voltage-controlled oscillator VCO 27 as the voltage for controlling its oscillation. An oscillation clock of the VCO 27 is delivered to the A/D converter 24 as a sampling clock thereof.

The phase-error detection circuit 25 is prepared by way of utilizing the above-described phase-error detection circuit 12 shown in FIG. 2. As was described earlier, in the phase-error detection circuit 25, using a proper threshold voltage, the provisional judge circuit 11 provisionally judges the data signal fed to the A/D converter 24 into three levels of 1, 0 and –1. Next, based on the result of provisional judgment, among the data signal being input, the pattern detector 14 checks transition pattern from the one-clock-preceding data signal to the actually present data signal. When a specific pattern has been detected, the pattern detector 14 instructs the selector 15 to select data signal output from the A/D converter 24.

Next, in accordance with [on] the instruction of the pattern detector 14, the selector 15 selects phase-error data out from data signals output from the A/D converter 24, and then converts the phase-error data into current before externally delivering it. After being integrated by a loop filter 26, the error-detect current is delivered to a voltage-controlled oscillator VCO 27 as the voltage for controlling its oscillation. An oscillation clock of the VCO 27 is delivered to the A/D converter 24 as a sampling clock thereof.

By combining the above-referred A/D converter 24, the phase-error detection circuit 25, the loop filter 26, and the VCO 27, a novel PLL (phase-locked loop) circuit is formed, where the PLL circuit executes phase locking in order that phase difference between the input signal received by the A/D converter 24 and the sampling clock of the A/D converter 24 becomes zero. Digital data quantized by the A/D converter 24 is treated with a variety of processes in DSP (digital signal processing) circuit 28 which is capable of functioning as a Viterbi decoder or the like.

As was described above, according to the present invention, by way of providing a phase-error detection circuit comprising a pattern detector which detects a pattern of a waveform of an input signal to an A/D converter, and then, based on the result detected by the pattern detector, extracts a phase error from the data signal output from the phase-error detection circuit, phase locking is executed by causing a phase-error output from the phase-error detection circuit to be fed back to the A/D converter. This arrangement minimizes loss time in the loop of the PLL circuit and leads to the improved loop gain, thus realizing a wide-capture range. Further, unlike the pulse-detection system, even when dispensing with adjustment of timing by way of inserting a clock delay circuit between the output terminal of the VCO and the sampling clock signal input terminal of the A/D converter, the novel PLL circuit of the present invention can realize high-precision phase matching.

What is claimed is:

1. A PLL (Phase-Locked Loop) circuit comprising;
   an A/D converter which quantizes an input signal substantially being equalized into a waveform conforming to a partial-response system; and
   a phase-error detection circuit including a pattern detector which detects a pattern of a waveform of the input signal to said A/D converter, which extracts phase error data from output data from said A/D converter in accordance with a result of detection by said pattern detector, wherein:
   said PLL circuit executes phase locking by causing the phase error data output from said phase-error detection circuit to be fed back to said A/D converter, wherein said phase-error detection circuit further includes a selector which, based on the result of detection by said pattern detector, selects the phase-error data from the output data from said A/D converter.

2. The PLL circuit according to claim 1, further comprising;
   a loop filter which integrates phase error selected by said selector; and
   a voltage-controlled oscillator (VCO) which oscillates frequency corresponding to an integrated result output from said loop filter and delivers an oscillated clock to said A/D converter as a sampling clock of said A/D converter.

3. The PLL circuit according to claim 2, wherein said phase-error detection circuit further includes a provisional judge circuit which provisionally judges the pattern of the waveform of the input signal to said A/D converter, wherein said pattern detector detects four patterns of transition of data value from 1 to 0, from 0 to –1, from –1 to 0, and from 0 to 1, after a provisional judgment output from said A/D converter judged to be 0 to said loop filter.

4. A recorded data reproduction apparatus comprising;
   an equalizer which equalizes a signal read from a recording medium into a waveform conforming to a partial response system;
   an A/D converter which quantizes a signal substantially equalized into a waveform of a partial-response-system by said equalizer; and
   a PLL circuit comprising:
     a pattern detector which detects a waveform pattern of an input to said A/D converter; and
     a phase-error detection circuit which, based on a result of detection by said pattern detector, extracts a phase error from output data from said A/D converter,
     wherein said PLL circuit executes phase locking by causing the phase error output from said phase-error detection circuit to be fed back to said A/D converter,
     wherein said phase-error detection circuit further includes a provisional judge circuit which provisionally judges the pattern of the waveform of the input signal to said A/D converter,
     wherein said pattern detector detects four patterns of transition of data value from 1 to 0, from 0 to –1, from –1 to 0, and from 0 to 1, after a provisional judgment by said provisional judge circuit so as to supply data output from said A/D converter judged to be 0 to a loop filter.

5. The PLL circuit according to claim 4, further comprising;

said loop filter which integrates the phase error selected by said selector; and a voltage-controlled oscillator (VCO) which oscillates frequency corresponding to an integrated result output from said loop filter and delivers an oscillated clock to said A/D converter as a sampling clock of said A/D converter.

6. A recorded data reproduction apparatus comprising:

means for equalizing a signal read from a recording medium in a waveform conforming to a partial response system;

means, including an A/D converter, for quantizing a signal substantially equalized into a waveform of a partial-response-system by said equalizing means and PLL circuit means comprising:

means for detecting a waveform pattern of an input to said quantizing means, and detecting at least four patterns of transition of data from 1 to 0, from 0 to −1, from −1 to 0, and from 0 to 1, after preliminarily judging said input to supply a data output from said quantizing means to be 0; and means for extracting a phase error from said output data from said quantizing means based on a result of said detection means, wherein said PLL circuit means executes phase locking by causing the phase error output from said phase-error detection means to be fed back to said A/D converter.

* * * * *